United States Patent [19]
Robertson, Jr. et al.

[11] Patent Number: 5,689,403
[45] Date of Patent: Nov. 18, 1997

[54] INTERCOOLED ELECTRONIC DEVICE

[75] Inventors: William H. Robertson, Jr., Plantation; David E. Reiff; Richard A. Ceraldi, both of Ft. Lauderdale; Sivakumar Muthuswamy, Plantation; Craig K. Gygi, Sunrise; Jesse E. Galloway, Miami; Andrzej T. Guzik, Pompano Beach; MacWilliam Branan, Ft. Lauderdale, all of Fla.

[73] Assignee: Motorola, Inc., Schaumburg, Ill.

[21] Appl. No.: 363,789

[22] Filed: Dec. 27, 1994

[51] Int. Cl.⁶ .................................................. H05H 7/20
[52] U.S. Cl. ..................... 361/695; 361/707; 361/715; 361/814; 415/128
[58] Field of Search ............... 361/690, 694–697, 361/707, 709–711, 715–716, 724, 728–730; 455/115, 117, 128

[56] References Cited

U.S. PATENT DOCUMENTS

| 5,020,138 | 5/1991 | Yasuda et al. | 361/695 |
| 5,029,236 | 7/1991 | Yasuda et al. | 361/697 |

OTHER PUBLICATIONS

890AT, 1992, Yaesu USA.

*Primary Examiner*—Gregory D. Thompson
*Attorney, Agent, or Firm*—Andrew S. Fuller

[57] ABSTRACT

An intercooled electronic device, includes a thermally conductive chassis (110), a substrate (120) mounted onto the chassis (110), a housing (104) formed around the chassis (110), and a cooling fan (130) mounted internally within the housing (104). The substrate (120) carries electrical circuitry including at least one heat-generating component (122) which is thermally coupled to the chassis (110). The cooling fan (130) is oriented to direct air across the chassis (110).

7 Claims, 1 Drawing Sheet

200

5,689,403

INTERCOOLED ELECTRONIC DEVICE

FIELD OF THE INVENTION

This invention relates in general to devices incorporating heat generating electronic components, and more particularly, devices requiring substantial heat dissipation.

BACKGROUND OF THE INVENTION

High power electronic devices, such as high power mobile two-way radios, audio amplification devices, and the like, typically generate substantial heat which requires dissipation. In the case of a high power radio frequency (RF) communication device with a large power output requirement, such as 100 watts or more, substantial heat can be generated which requires dissipation. Commonly available RF power ammplifiers tend to be inefficient, with a typical rating of 30% efficiency. Accordingly, for a given power consumption, 30% of the power is captured for useful output, and 70% ends up as heat which must be dissipated to protect the components of the communication device. Thus, to output 100 watts of RF power, an RF communication device may require over 200 watts of power dissipation in the form of heat. Prior art heat dissipation techniques for such high power RF communication devices typically include the use of large heat sinks situated externally to the main portion of the communication unit in order to effectively dissipate a substantial quantity of heat. Because of the size of these heat sinks, it is common to find the power amplification circuitry and associated heat sink mounted in a location remote from that of the control portions of the communication unit. For example, in an automobile installation environment, the control portion (commonly known as the control head) would be mounted in a dashboard location, while the power amplifier and associated heat sink would be trunk mounted. Other approaches include the use of a large finned heat sink mounted to a portion, usually the rear, of the communication unit. Here, an externally mounted cooling fan might be included to direct air over the external heat sink to help in heat dissipation.

The market for high power communication devices have consistently demanded smaller and more compact communication units. With the advent of more densely packaged electronics, substantial advances have been made toward a reduction in size of the radio communication circuitry. However, corresponding advances with respect to the efficiency of high power RF power amplifiers have not kept pace. Consequently, even though most of the device electronics can be housed in a smaller package, substantial space must still be used to accommodate the required heat dissipation elements. As such, the reduction in size of high power communication devices have lagged behind the reduction in size of other electronic devices that do not require substantial heat dissipation.

It is desirable to substantially reduce the size of electronic devices, incorporating electrical components which require substantial heat dissipation. Accordingly, there exists a need for an improvement in the design of such devices.

DETAILED DESCRITPION OF THE PREFERRED EMBODIMENT

Figure 1:
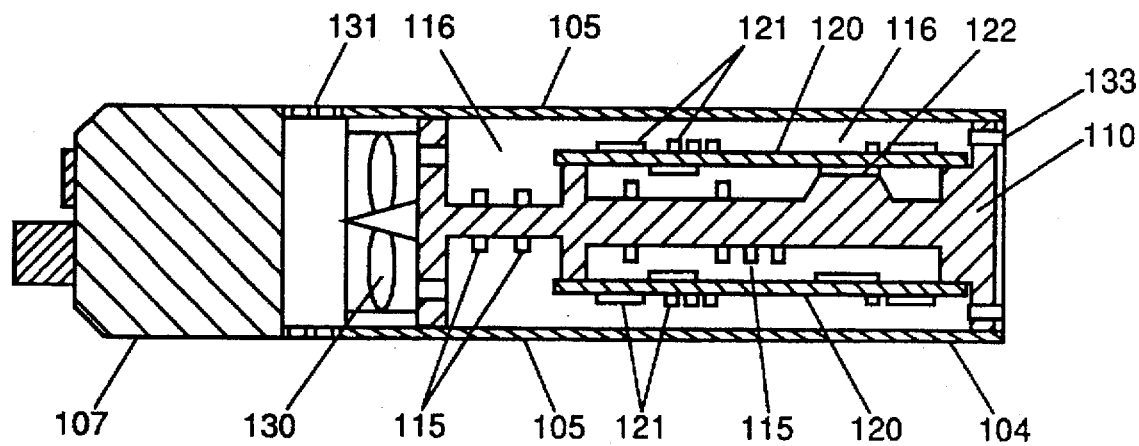
FIG. 1 is a cross-sectional view of a high power radio frequency communication device, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for an intercooled electronic device with an internally mounted thermally conductive chassis, which functions as a heat sink, and as the primary support structure for circuit components of the electronic device. An internally mounted cooling fan provides active cooling to the internal chassis/heat sink. In one embodiment, the chassis includes sealed compartments in which the circuit components are located, and an integrally formed cooling duct. The sealed compartments protect the circuit components from environmental contaminants as air is directed through the cooling duct.

FIG. 1 is a cross-sectional view of an intercooled high power mobile radio frequency electronic communication device 100, in accordance with the present invention. The communication device 100 includes, among other structural components, a thermally conductive chassis or heat sink 110, circuit carrying substrates 120, an internal cooling fan 130, a housing 104, and a control head 107 which houses control components for the device 100. The chassis 110 forms a primary support or infrastructure support for the major components of the communication device. The chassis 110 also forms the primary heat dissipating member or heat sink for the communication device 100. Accordingly, the chassis is preferably formed from cast-metal such as aluminum, or other material with a high heat transfer rate. Heat dissipating elements or fins 115 formed on the chassis 110 increase the surface area of the chassis 110 and facilitate convectional heat transfer to surrounding air.

The circuit carrying substrates 120 are mounted on the chassis 110 and house electrical components 121 which constitute a substantial portion of the electrical circuitry of the communication device 100. At least one heat generating component, such as a RF power amplifier 122, is included on one of the substrates 120 and is mounted to thermally engage or to be thermally coupled to the chassis 110. The housing 104 includes housing panels 105 mounted onto the chassis 110. Thus, thus the chassis 110 is mounted internally within the housing 104, and provides structural support or an infrastructure therefor. The cooling fan 130 is mounted internally within the housing and is mechanically coupled to the chassis. The cooling fan 130 is oriented to direct air across the chassis and across the electrical components, and especially the heat generating components. In the preferred embodiment, the cooling fan 130 forces air into the device 100 through air inlets 131 formed in the housing 104. The air passes through air ducts or passages 116 formed between the heat sink/chassis and portions 105 of the housing 104, and then is forced out of the device 100 through air outlets 133 formed in the housing 104.

Figure 2:
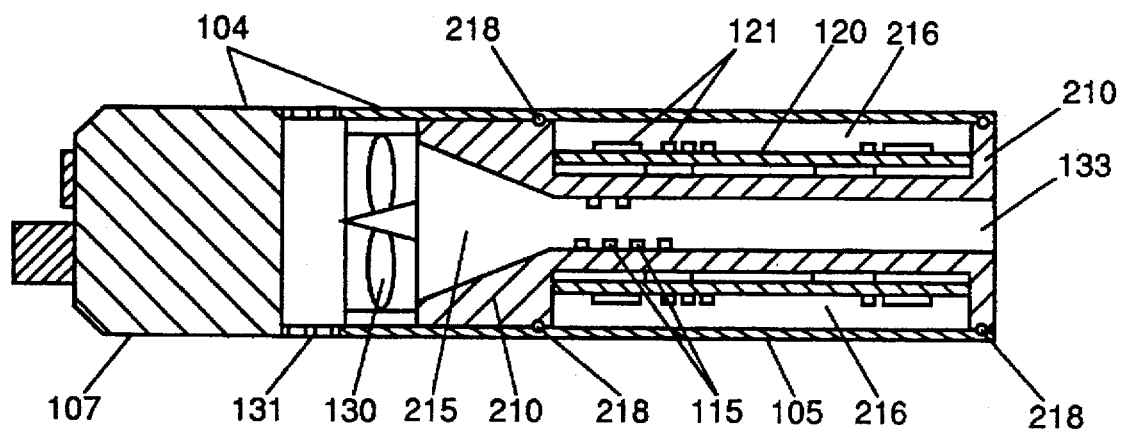
FIG. 2 is a second embodiment of the high power radio frequency communication device, in accordance with the present invention.

FIG. 2 shows a second embodiment of the high power radio frequency communication device 200, in accordance with the present invention. Like reference numerals are carried forward and the variations in structure distinguished. As before, the communication device 200 has an internally mounted chassis 210 which serves as a primary support structure for circuit carrying substrates 120 and associated electrical components 121, 122 of the communication device 200, and also as a primary heat dissipating member for the heat generating components 122 of the communication device 200. Housing panels 105 mounted to the chassis help form the housing 104 for the communication device 200.

In this embodiment, the chassis 210 includes two integrally formed or molded compartments 216, which are designed to house the circuit carrying substrates and associated electrical components 121, 122. Each compartment is sealed against a housing panel 105 by an O-ring 218. The O-ring 218 is situated between the chassis and the housing panel 105 to form a sealed compartment or enclosure. The circuit carrying substrate 120 and associated electrical components 121, 122 are housed in one or more of such sealed compartments. The sealed compartment 216 protects the electrical circuitry from environmental contaminants, such as water, dust, and the like. The RF power amplifier 122, or other heat generating component, thermally engages the chassis within the compartment. Thus, there is a substantially unrestricted thermally conductive path between the power amplifier 122 and the chassis 210.

The chassis 210 also has an air or cooling duct 215 formed therein to facilitate the passage of air through the communication device 200. Preferably, the cooling duct 215 extends along the entire chassis 210 or a substantial portion thereof. In the preferred embodiment, the cooling duct 215 is formed between two sealed compartments 216. Heat dissipating elements or fins 115 are formed within the cooling duct. The internal cooling fan 130 is mounted within the housing 104 and oriented to direct air through the cooling duct 215 and across the heat dissipating fins 115. Air inlets 131 formed in the housing panels 105 permit air to be drawn by the cooling fan 130 within the communication device 200, and to be forced through the cooling duct 215 and out of the communication device 200 through air outlets 133. As air is drawn through the communication device 200, contaminants such as moisture and dust inevitably enters the device 200. However, the sealed electronic components 121, 122 are protected, thus providing for a more reliable electronic device.

The present invention offers significant advantages over the prior art. An internal heat sink/chassis serves as the primary support structure for the electronic components of the device, and as the primary heat dissipation member. The heat sink/chassis, together with an active cooling system provided by the mechanically coupled cooling fan, substantially reduce the size and associated weight of the heat sink required to dissipate the substantial amount of heat typically associated with such devices. In one embodiment, the heat sink/chassis is formed to have sealed compartments to accommodate circuit substrates carrying the electronic circuitry of the device. The sealed compartments protect the internal circuitry of the device from damage due to environmental contaminants such as water, dust, moisture and the like. Accordingly, a smaller, lighter, and more reliable communication device can be manufactured using the concepts embodied in the present invention.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An intercooled electronic device, comprising:

a thermally conductive chassis having first and second sealed compartments formed therein, and a cooling duct formed between the first and second sealed compartments;

a substrate mounted within the first sealed compartment of the thermally conductive chassis, the substrate carrying electrical circuitry including at least one heat-generating component which is thermally coupled to the thermally conductive chassis;

a housing formed around the thermally conductive chassis; and a cooling fan mounted internally within the housing and oriented to direct air across the thermally conductive chassis;

wherein the cooling fan is oriented to direct air through the cooling duct.

2. The intercooled electronic device of claim 1, wherein the thermally conductive chassis has heat dissipating elements located within the cooling duct.

3. An intercooled electronic device, comprising:

a housing;

chassis mounted within the housing, the chassis being formed from a material having a high heat transfer rate, the chassis having a compartment formed therein, the compartment being substantially sealed, the chassis having a cooling duct extending longitudinally therein;

a substrate mounted onto the chassis within the compartment, the substrate carrying electrical circuitry including at least one heat-generating component which is thermally coupled to the chassis; and a cooling fan mounted internally within the housing and oriented to direct air through the cooling duct longitudinally along the chassis.

4. The intercooled electronic device of claim 3, wherein:

the compartment is sealed between the chassis and a portion of the housing.

5. The intercooled electronic device of claim 3, wherein:

the chassis has first and second sealed compartments; and the cooling duct is formed between the first and second sealed compartments.

6. A high power radio frequency communication device, comprising:

a housing;

a chassis mounted within the housing, the chassis being thermally conductive, the chassis having a compartment formed therein, the compartment being substantially sealed between the chassis and a portion of the housing, the chassis has a cooling duct extending longitudinally therethrough, the cooling duct having heat dissipating elements formed therein;

a substrate mounted onto the chassis within the compartment, the substrate carrying electrical circuitry including a radio frequency power amplifier which is thermally coupled to the chassis; and a cooling fan mounted internally within the housing and oriented to direct air longitudinally through the chassis via the cooling duct.

7. A high power radio frequency communication device, comprising:

housing;

a chassis mounted within the housing, the chassis being thermally conductive, the chassis having a compartment formed therein, the compartment being substantially sealed between the chassis and a portion of the housing, the chassis has a cooling duct extending therethrough, the cooling duct having heat dissipating elements formed therein;

a substrate mounted onto the chassis within the compartment, the substrate carrying electrical circuitry including a radio frequency power amplifier which is thermally coupled to the chassis; and a cooling fan mounted internally within the housing and oriented to direct air through the cooling duct;

wherein:

the chassis has first and second sealed compartments; and the cooling duct is formed between the first and second sealed compartments.

* * * * *

UNITED STATES PATENT AND TRADEMARK OFFICE
CERTIFICATE OF CORRECTION

PATENT NO. : 5,689,403
DATED : November 18, 1997
INVENTOR(S) : Robertson, Jr., et al.

It is certified that error appears in the above-identified patent and that said Letters Patent is hereby corrected as shown below:

On the title page:

Item [75], in the listing of inventors, after "Mac William Branan, Ft. Lauderdale", insert --Anthony J. Suppelsa, Coral Springs,--.

Signed and Sealed this

Fourteenth Day of July, 1998

Attest:

BRUCE LEHMAN

*Attesting Officer*       *Commissioner of Patents and Trademarks*